(12) United States Patent
Zollo et al.

(10) Patent No.: US 6,928,726 B2
(45) Date of Patent: Aug. 16, 2005

(54) CIRCUIT BOARD WITH EMBEDDED COMPONENTS AND METHOD OF MANUFACTURE

(75) Inventors: James A. Zollo, Weston, FL (US); John K. Arledge, Ft. Lauderdale, FL (US); John C. Barron, Davie, FL (US); Gary R. Burhance, Boynton Beach, FL (US); John Holley, Dacula, GA (US); Henry F. Liebman, Tamarac, FL (US)

(73) Assignee: Motorola, Inc., Schaumburg, IL (US)

( * ) Notice: Subject to any disclaimer, the term of this patent is extended or adjusted under 35 U.S.C. 154(b) by 90 days.

(21) Appl. No.: 10/626,058

(22) Filed: Jul. 24, 2003

(65) Prior Publication Data

US 2005/0016763 A1 Jan. 27, 2005

(51) Int. Cl.[7] .............................. H05K 3/30; H05K 1/16
(52) U.S. Cl. .............................. 29/832; 29/825; 29/830; 29/852; 174/260; 174/262; 361/330; 361/760
(58) Field of Search .......................... 29/825, 830, 832, 29/852; 361/330, 760; 174/260, 262

(56) References Cited

U.S. PATENT DOCUMENTS

| 4,758,922 | A | * | 7/1988 | Ishigaki et al. ............. 361/330 |
| 5,418,690 | A |   | 5/1995 | Conn et al. |
| 5,708,569 | A | * | 1/1998 | Howard et al. ............. 361/760 |
| 5,834,994 | A | * | 11/1998 | Shapiro ..................... 333/202 |
| 6,218,729 | B1 | * | 4/2001 | Zavrel et al. ............... 257/698 |
| 6,443,179 | B1 |   | 9/2002 | Benavides et al. |
| 6,577,208 | B2 | * | 6/2003 | Kushitani et al. .......... 333/174 |
| 6,750,737 | B2 | * | 6/2004 | Uriu et al. .................. 333/133 |

FOREIGN PATENT DOCUMENTS

| JP | 10-215042 | * | 8/1998 |
| JP | 2002-223076 | * | 8/2002 |

* cited by examiner

Primary Examiner—Carl J. Arbes
(74) Attorney, Agent, or Firm—Akerman Senterfitt (57) ABSTRACT

A substrate assembly (10) and method of making same has at least one embedded component (25) in a via (24) of a substrate core (22) and includes a first adhesive layer (20) coupled to the substrate core, and a second adhesive layer (26) on at least portions of a top surface of the substrate core and above portions of the embedded component. The substrate assembly can further include a first conductive layer (18) adhered to the bottom surface of the substrate core and a second conductive layer (28) on the second adhesive layer. The substrate assembly can further include an interconnection (36) between a conductive surface of the embedded component and at least one among the first conductive layer and the second conductive layer. The interconnection can be formed through an opening (34) that at least temporarily exposes at least a conductive surface (32) of the embedded component.

27 Claims, 5 Drawing Sheets

CIRCUIT BOARD WITH EMBEDDED COMPONENTS AND METHOD OF MANUFACTURE

CROSS-REFERENCE TO RELATED APPLICATIONS

Not applicable

FIELD OF THE INVENTION

This invention relates generally to circuit boards, and more particularly to circuit boards having embedded components.

BACKGROUND OF THE INVENTION

The increasingly widespread use of fine-pitch Ball-Grid Array (BGA), Chip Scale Packaging (CSP), and other evolving technology form-factors means that new fabrication techniques must be used to create printed circuit boards (PCBs) and architectures for placing components thereon. Additionally, efforts to reduce costs further compound the problems associated with the smaller, denser, lighter, and faster systems that are evolving.

As integration continues to shrink the space required for mounting the active components in an electronic device, the routing density and the mounting density of the accompanying passive components becomes an increasingly problematic issue. Capacitors and resistors in chip component format can actually take up more space than the active circuit components, and cause great difficulty in circuit design. Many of these passive components are used as noise protection and grounding shunts on integrated circuit inputs and outputs. Ideally they should be located as close as possible to the actual IC pin connection. Since many IC's now come packaged in ball grid array format, it is impossible to locate a chip component directly adjacent to the lead it is supposed to connect.

One solution put forward is to integrate the passive components into the silicon on an integrated circuit. Since integration into the silicon is not often very practical, designers have sought to integrate the passives into the substrate. The most cost effective substrate is usually an organic printed circuit board. Integrating capacitors into these types of structures presents an obvious problem of size. The available space and layering only permits a small number of very low value capacitors to be integrated using the standard organic layer structure.

There are a couple of avenues being pursued for integrating resistors. The resistive foil layer (Ohmega-ply) and vacuum deposited resistor methods each present barriers of cost and infrastructure. Polymer thick film resistors are notoriously unreliable and variable, presenting a problem with achieving tight tolerances.

Thus, a reliable method and assembly for integrating components on a circuit board such as a multi-layer board that overcomes at least some of the detriments described above would be desirable.

SUMMARY OF THE INVENTION

Embodiments in accordance with the present invention enable a way to integrate components such as discrete resistor, inductor, and capacitor components or other suitable components into a PCB. In one aspect, embodiments can use existing surface mount chip components deployed in a novel manner in a Z-axis assembly. By burying the discrete components inside the substrate in a substantially vertical orientation, this technology allows a true Z-axis assembly of by-pass devices through the substrate. This approach facilitates a very clean self-shielding design, although the present invention is certainly not intended to be limited to such arrangements alone. The Z-axis orientation and the listed components are merely listed as exemplary structures and not intended to limit the scope of the invention.

Generally, embodiments in accordance with the present invention can include a component or components in a buried through hole on a circuit board, and encapsulation of the board including the components inside an applied dielectric layer. Openings can then be made to allow those components to communicate with the required electronic circuits using vias and plating techniques.

In a first aspect in accordance with an embodiment of the present invention, a method of forming an embedded component in a substrate assembly can include the steps of applying a first adhesive layer on a first carrier, placing a substrate having at least a via on the adhesive layer, placing the embedded component having at least two conductive terminations in the via, applying a second adhesive layer on at least portions of the pre-processed substrate and above at least portions of the embedded component, placing a second carrier on the second conductive layer, and biasing the first and second carriers towards each other to create the substrate assembly having the embedded component between the first and second adhesive layers. The adhesive layer is preferably made from dielectric materials such as epoxies and other thermosetting organic materials, or PTFE and other thermoforming organic materials, although other materials conceivable used for circuit boards are certainly contemplated herein.

In a second aspect, a method of forming an embedded component in a substrate assembly can include the steps of applying a first conductive layer on a first carrier, applying a first adhesive layer on the first conductive layer, placing a pre-processed substrate on the adhesive layer, wherein the pre-processed substrate can include at least a via (and optional conductive patterns on either side of the pre-processed substrate), and placing the embedded component having at least two conductive terminations in the via. The method can also include the steps of applying a second adhesive layer on at least portions of the pre-processed substrate and above at least portions of the embedded component, applying a second conductive layer on the second adhesive layer, placing a second carrier on the second conductive layer, and biasing the first and second carriers towards each other to create the substrate assembly having the embedded component between the first and second conductive layers. The method can further include the steps of removing at least one among the first carrier and the second carrier, forming an opening through at least one pair of layers among a first pair formed from the first conductive layer and the first adhesive layer and a second pair formed from the second conductive layer and the second adhesive layer to expose at least a conductive surface of the embedded component, and forming an interconnection between the conductive surface of the embedded component and at least one among the first conductive layer and the second conductive layer having the opening. The first conductive layer and/or the second conductive layer can have a conductive pattern formed thereon. An interconnection can also be made between the conductive surface of the embedded component, the first or second conductive layer and a portion of the conductive patterns on the substrate core.

In a third aspect of the present invention, a substrate assembly having at least one embedded component in a via of a substrate core can include a first adhesive layer coupled to a bottom surface of the substrate core, an embedded component in the via, and a second adhesive layer on at least portions of a top surface of the substrate core and above at least portions of the embedded component, wherein at least one among the first adhesive layer and the second adhesive layer at least partially fills the via. The substrate assembly can further include a first conductive layer adhered to the bottom surface of the substrate core using the first adhesive layer and a second conductive layer on the second adhesive layer. The substrate assembly can further include an interconnection between a conductive surface of the embedded component and at least one among the first conductive layer and the second conductive layer. The interconnection can be formed through an opening that at least temporarily exposes at least a conductive surface of the embedded component. As mentioned above, an interconnection can also be formed between the conductive surface of the embedded component, the first or second conductive layer and a portion of conductive patterns on the substrate core.

DETAILED DESCRIPTION OF THE DRAWINGS

Generally, embodiments in accordance with the present invention take a different approach to integrating components in a multilayer board. In several embodiments, a substrate assembly and method of making same takes advantage of the most common methods of fabricating High Density Interconnect (HDI) structures and printed circuit boards. Before describing the process of manufacture in detail, a brief description of the components in the structure as shown in FIGS. 1 and 2 will facilitate the description of the process of manufacture.

Figure 1:
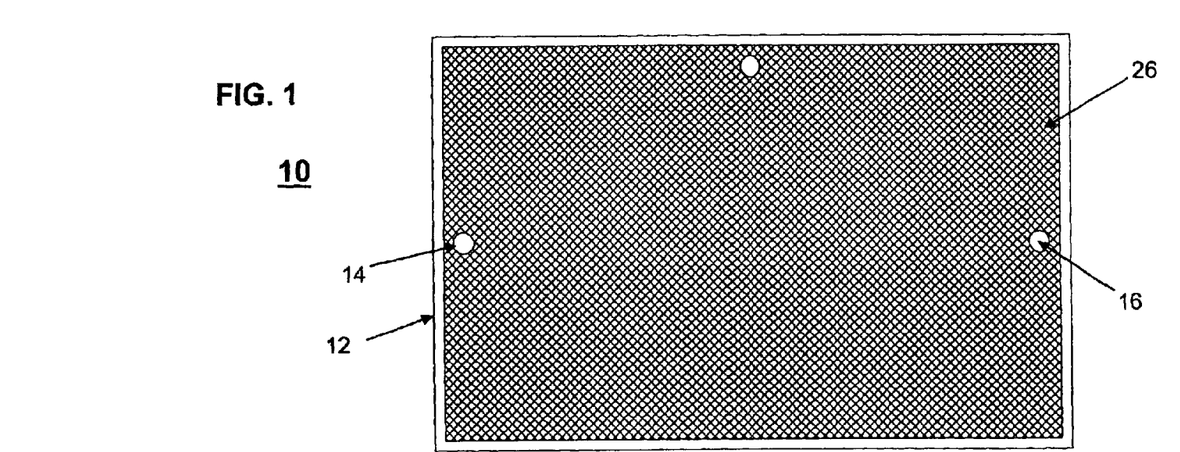
FIG. 1 is a top view of a substrate assembly with a conductive layer exposed in accordance with the present invention.

A top view of a portion of a substrate assembly 10 including a pin alignment system is shown in FIG. 1 including a first or bottom carrier 12, and pins 14 and 16. The top view in this instance illustrates, for example, an adhesive layer 26 as a top layer when a second or top carrier 30 is removed (and no conductive layer (28) is present). The first and second carriers 12 and 30 can serve as a press in a lamination process as will be discussed further below. A more complete view of the substrate assembly 10 is shown in a cut view form in FIG. 2. The assembly 10 from the bottom up can include the first carrier 12 and pins 14 and 16 used primarily for alignment purposes, an optional first conductive layer 18 coupled to a pre-processed substrate core 21 via an adhesive layer 20. The pre-processed substrate core 21 can include a substrate 22 having conductive patterns 27 on either side of the substrate 22 as well as vias 24. The vias can be drilled holes or vias made in any other manner. It should be understood within contemplation of the present invention that the pre-processed substrate core 21 can also be a bare substrate without any conductive patterns on either side or conductive patterns on just one side of the substrate 22. A component or components 25 can be placed within the via or vias 24. Although a single component is shown in a Z-axis orientation, it should be understood that multiple components can be placed in the via 24 and other orientations can be used as long as a conductive surface of the component can subsequently be exposed as will become more apparent with reference to the description of FIG. 7. A second adhesive layer 26 is applied on top of the component and at least portions of the pre-processed substrate core 21. A second optional conductive layer 28 can couple to the pre-processed substrate core 21 using the adhesive layer 26. On top of the conductive layer 28 resides the second carrier or press plate 30.

Figure 2:
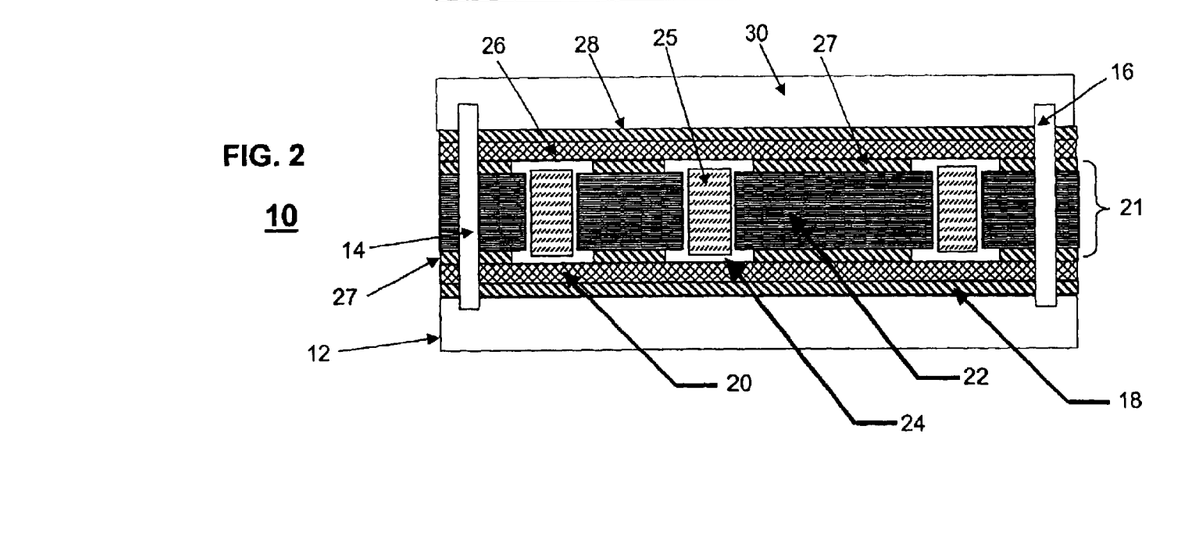
FIG. 2 is a cut view of the substrate assembly in accordance with the present invention.
Figure 2A:
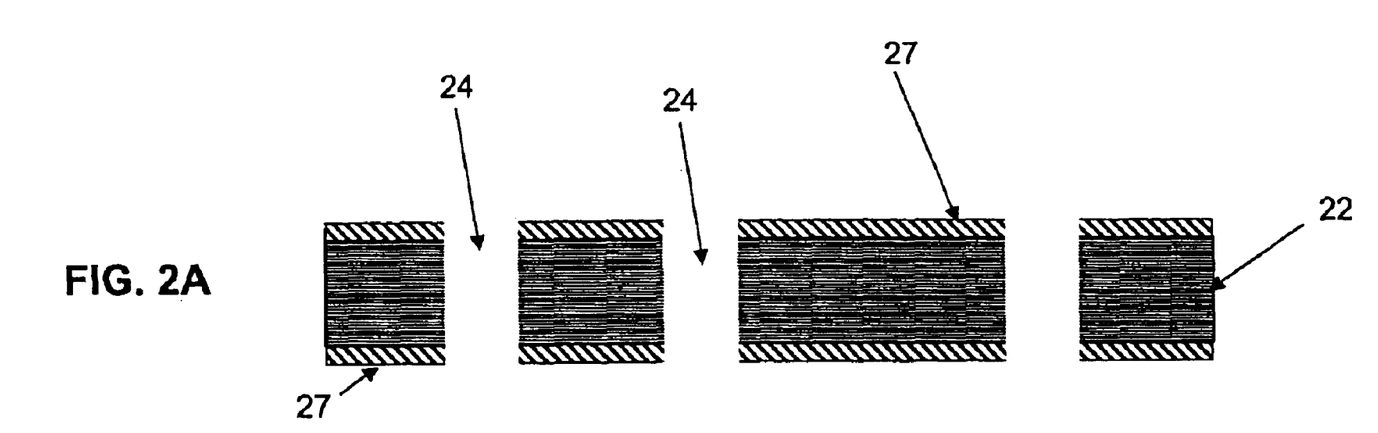
FIG. 2A is a cut view of a substrate core with drilled holes as used in the substrate assembly in accordance with the present invention.
Figure 2B:
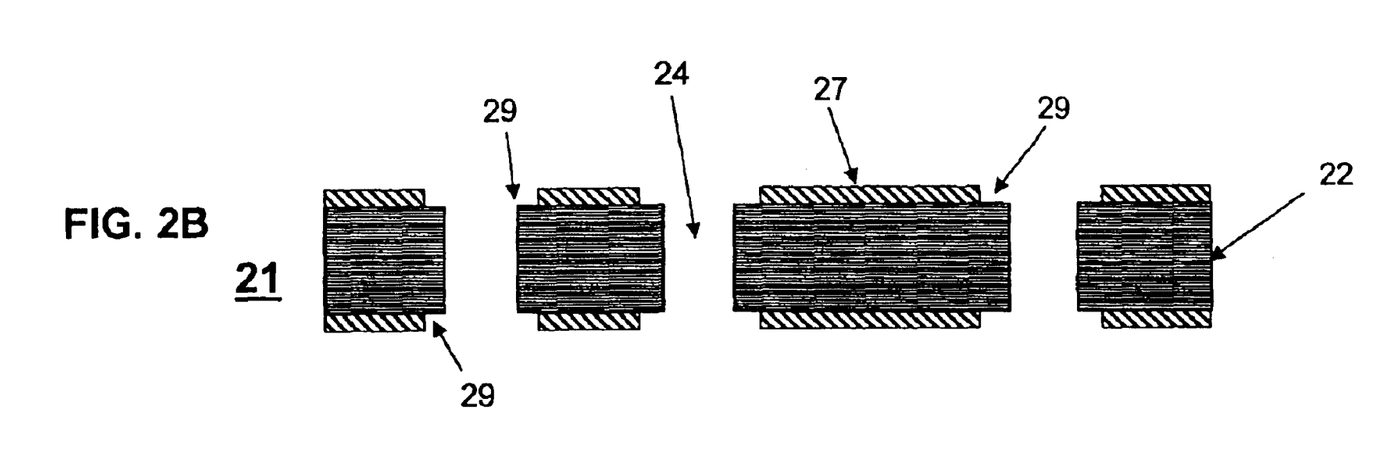
FIG. 2B is a cut view of the substrate core of FIG. 2A after imaging of the conductive layers of the substrate core in accordance with the present invention.

Essentially, in most embodiments as shown in FIGS. 2, 2A and 2B a series of holes or vias 24 can be drilled through a substrate 22 and conductive surfaces 27 (that form a substrate core board 21) in an optimal position as close to the IC pins as possible. With HDI structures, this would typically mean a hole directly under the solder pad for the IC pin (See FIG. 10). A chip component (25) with up to a length substantially equal to the thickness of the core PCB (21) can then be disposed into the via 24. Next, an HDI layer such as an adhesive or dielectric layer (20 and 26) would be applied on both sides of the substrate core 21 encapsulating the core and its passive chip components. The HDI vias would then be created as required to complete the circuit as well as make contact to both ends of the passive components from opposite sides of the substrate. Finally the vias would be plated and the circuit would be completed. The process of manufacturing such an assembly is described in further detail below using the example of a simple 1-2-1 HDI circuit board using the most common HDI processes which involves using resin coated foil outer layers with laser vias. The resin coated foil layers serve as the first and second adhesive layers and the first and second conductive layers in this example. It should be understood that the present invention is not limited thereto, and that other adhesive layers can be used such as epoxy resin coats, epoxies and other thermosetting organic materials, and PTFE and other thermoforming organic materials, fiberglass reinforced prepreg layers, thermal plastic dielectric layers, paste dielectrics, and liquid dielectrics. The conductive layers are typically copper, but numerous other conductors can be used within contemplation of the present invention.

With reference to FIGS. 2A and 2B, the process can begin with substrate core 21 which can be a copper clad laminate of a proper thickness. The proper thickness preferably is substantially equal to the length of the components (such as chip components) to be integrated. The substrate core 21 can be drilled through the copper cladding or conductive patterns 27 and the substrate 22 in a pattern designed to accept the component applied in the intended position or orientation inside a via or vias 24. In this instance, drill sizes are chosen to allow the chip components to orient vertically in the holes in such a way that the metallized ends of the chip component will be in a predictable position. During this step all required lamination tooling holes (not shown) would also be drilled. The lamination tooling holes would receive the pins 14 and 16 shown in FIG. 2.

Next, with reference to FIG. 2B, the inner layer circuit pattern or conductive pattern can be formed using such standard photolithography and etching techniques and materials as are well known to anyone skilled in the art. This patterned core board (21) can then preferably be cleaned and coated with a reduced oxide or some other roughening technique for adhesion promotion in the lamination step to follow.

Figure 3:
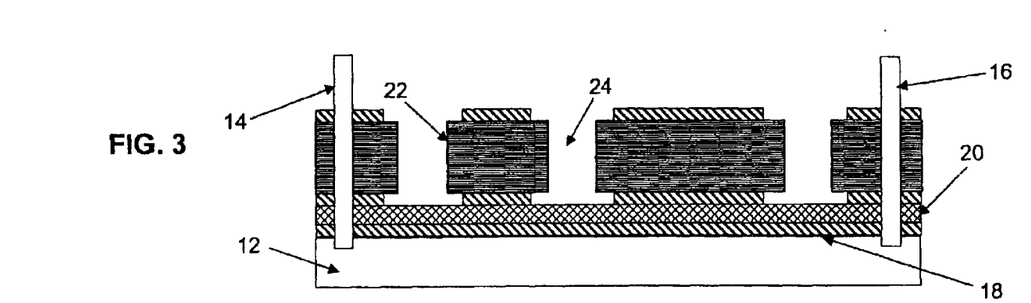
FIG. 3 is a cut view of a portion of the substrate assembly including a pre-processed substrate core having vias in accordance with the present invention.
Figure 4:
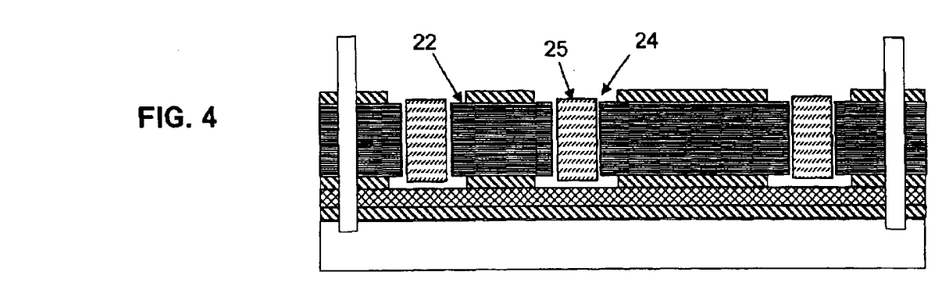
FIG. 4 is a cut view of the portion of the substrate assembly of FIG. 3, further including an embedded component in accordance with the present invention.

Referring to FIGS. 3 and 4, once the substrate core 21 is complete, the next step can include the placement of the component. But first, the substrate core 21 is prepared using a tooling plate or carrier 12 for the HDI lamination step and the alignment pins 14 and 16. This tooling plate with the proper tooling pins is laid out on the lamination lay-up work station. A first conductive layer 18 is applied to the carrier 12 followed by an adhesive (dielectric) layer 20. The first conductive layer 18 can be formed from a copper slip sheet which can optionally be added to allow for relative movement of the layers during heating. The first conductive layer 18 can also be formed from copper foil from a resin coated copper foil that can be laid on the tooling plate and located using the tooling pins with the epoxy side facing up. The adhesive layer 20 can be formed from the epoxy resin on the resin coated copper foil. The completed substrate core 21 from FIG. 2B can be laid in place over the tooling pins 14 and 16 on top of the resin coated foil to form the structure shown in FIG. 3. The components 25 can then be placed in the vias 24 as shown in FIG. 4. The processing of placing the components 25 into the vias 24 can be done by processing the entire assembly of FIG. 3 through a pick and place machine to place the chip components in the holes or vias 24. The chip components can be placed in the holes standing vertically on end. For example, a modified Nitto gang placement machine can drop the chip components into place in a vertical position inside the drilled holes, and inspect for missing devices.

Figure 5:
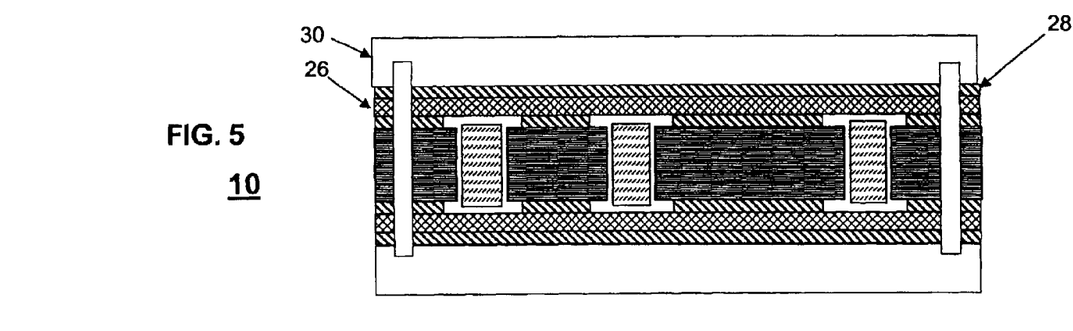
FIG. 5 is a cut view of the portion of the substrate assembly of FIG. 4, further including an adhesive layer above the embedded component and the substrate core in accordance with the invention.
Figure 6:
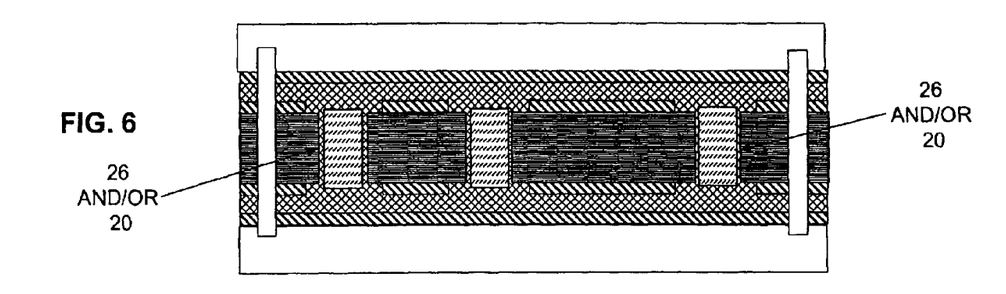
FIG. 6 is a cut view of the portion of the substrate assembly of FIG. 5, further illustrating a portion of the adhesive layer within the via during a lamination process in accordance with the invention.

With components 25 in all the holes or vias as required, the assembly of FIG. 4 can be brought back to the lamination lay-up station for placement of a second adhesive (dielectric) layer 26 and a second conductive layer 28 as shown in FIG. 5. Layers 26 and 28 can be a second resin coated copper foil layer laid over the top of the stack with the epoxy side against the substrate core 21. Optionally, another copper slip sheet (forming part of the conductive layer 28) and another tooling plate or second carrier 30 can be placed on top. Referring to FIG. 6, the entire stack shown in FIG. 5 can be biased or pressed and cured in a vacuum lamination press per standard industry procedures. During the press cycle the adhesive layers 26 and/or 20 in the form of the epoxy coating on the copper foil will flow filling the former via 24 around the components 25 as shown in FIG. 6. After the flow time the epoxy will gel and cure adhering the foil to the substrate core 21 on both the bottom and top sides of the substrate core. The passive components would thus be locked in place and integrated into the board. After the pressing operation, the assembly in FIG. 6 will be similar in appearance to the assembly of FIG. 5, with the exception that adhesive now surrounds a significant portion of the component.

Figure 7:
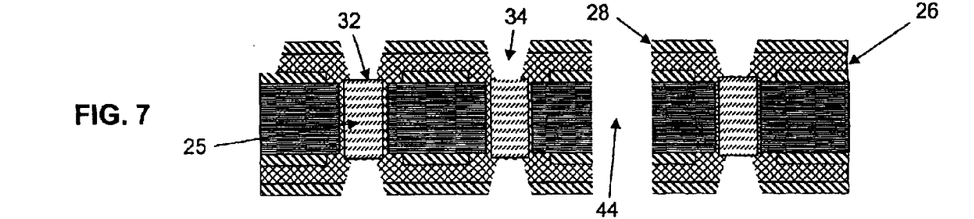
FIG. 7 is a cut view of the portion of the substrate assembly of FIG. 6, further illustrating the creation of vias to expose a conductive surface of the embedded component in accordance with the present invention.

With reference to FIG. 7, the assembly of FIG. 6 can be removed from the carriers 12 and 30 and pins 14 and 16, although additional processing can also potentially proceed by just removing one carrier and processing a corresponding side at a time. In any event, at this point, the assembly of FIG. 6 can have vias 44 formed such as holes drilled per standard methods to make front to back or interlayer via connections as required. Also at this point, a laser or other techniques can be used to make openings or vias 34 exposing a conductive surface 32 of the component 25. Ideally, a laser can make via openings precisely onto the ends of the chip components buried inside the core substrate. There are several commonly used methods of making laser vias, although the present invention is certainly not limited to such techniques. Such exemplary methods include: 1) using an ultraviolet (UV) laser to cut both the copper foil and the dielectric; 2) using the UV laser to cut the copper followed by an infrared laser to remove the revealed dielectric; and 3) etching holes in the copper foil using standard photolithographic and etching processes known to those skilled in the art, and then using an infrared laser to remove the dielectric thus exposed.

Figure 8:
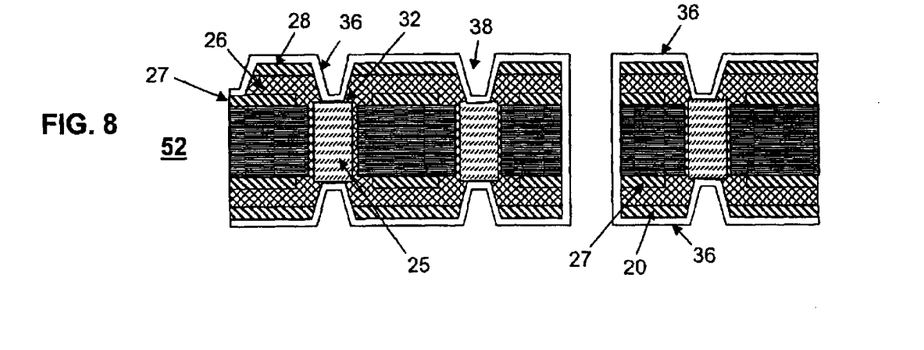
FIG. 8 is a cut view of the portion of the substrate assembly of FIG. 7, further illustrating a plating step in accordance with the present invention.
Figure 8A:
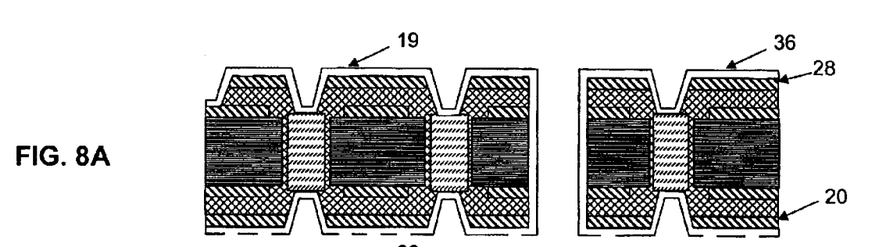
FIG. 8A or 8B is a cut view of the portion of the substrate assembly of FIG. 7, further illustrating a plating and etching (or patterning) step in accordance with the present invention.
Figure 8B:
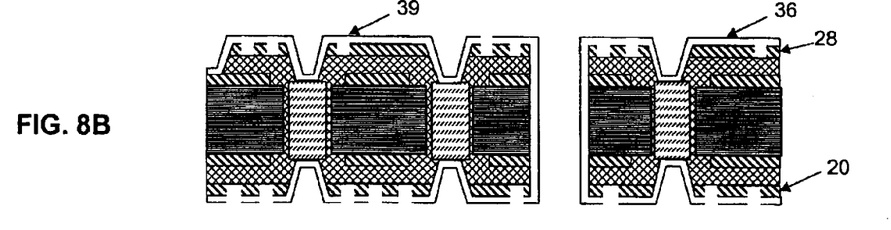

After creating both vias 34 and vias 44, which can include the openings to conductive surfaces of the components or the ends of the chip component pads, the assembly of FIG. 7 can be further processed and finished using standard plating, photolithography, and etching techniques familiar to anyone skilled in the art to form an assembly 52 as shown in FIG. 8. The plating 36 forms plated vias 38 and forms interconnections between the conductive surface 32 of the embedded component 25 and at least one among the first conductive layer 20 and the second conductive layer 28. An interconnection can also be made between the conductive surface 32 of the embedded component 25, the first or second conductive layer (20 or 28) and a portion of the conductive patterns 27 on the substrate core. In one embodiment, these interconnections can serve as an effective shield. If desired, as shown in FIG. 8A, patterns 19 can be formed from the plating 36 by selective plating, or photolithography and etching or by other means. Likewise, patterns 39 as shown in FIG. 8B can be formed in the plating 36 and conductive layers (20 and 28) as desired. The first conductive layer 20 and/or the second conductive layer 28 can also have a conductive pattern formed thereon before the process started in FIG. 7 of forming vias.

It is obvious to anyone skilled in the art that variations of this process are possible, but any process mounting chip components (or other components) vertically (or in other orientations) in a buried through hole inside an HDI structure, and then using HDI vias to make contact to the ends of the buried chip components would be contemplated by the embodiments disclosed herein. Variations include, but are not limited to, the use of photovias or plasma vias instead of lasers, or the use of liquid or paste dielectrics instead of resin coated foil, or the use of any integrated circuit or other component having at least two conductive terminations for embedded components rather than just chip components. For example, embodiments are contemplated for small, compact modules such as voltage controlled oscillators, RF front end circuits, and power amplifiers to mention a few. As more complex circuits or devices become smaller, the more likely such devices can serve as the embedded component herein. Adding additional layers or other levels of embedded components, as with sequential lamination techniques, would also be contemplated.

Figure 9:
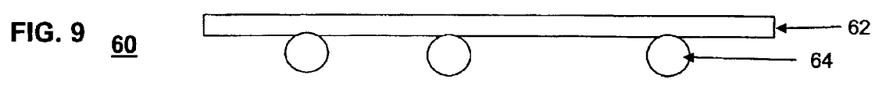
FIG. 9 is a cut view of a ball grid array (BGA) carrier.
Figure 10:
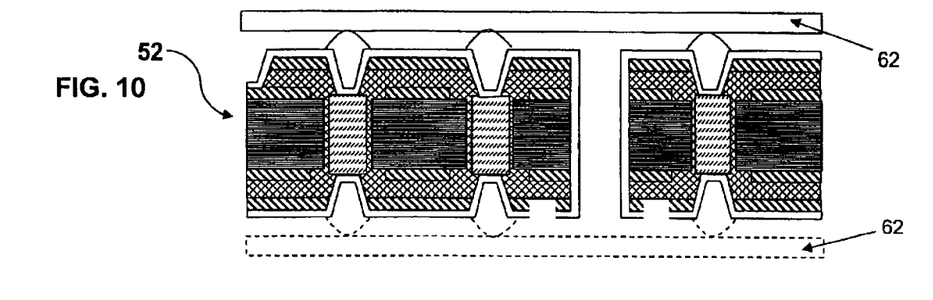
FIG. 10 is a cut view of the substrate assembly of FIG. 8, further illustrating the attachment of several BGA carriers in accordance with the present invention.

Embodiments in accordance with the present invention could also be used to fabricate any PCB, but might be especially applicable to fine line high density interconnect designs. The most immediate benefit lies in application to bypass devices on high pin count integrated circuit packages. Referring to FIGS. 9 and 10, a ball grid array (BGA) package 60 is an exemplary high pin count integrated circuit package. The BGA package 60 in its simplest form can include a substrate 62 and an array of solder balls 64. As shown in FIG. 10, one or more BGA packages can be attached to either side of the substrate assembly 52. This arrangement can be useful in instances where each of the pinouts (or balls in this case) needs to be shunted to ground via a capacitor. Thus, the embedded component (25) can be a capacitor and all or portions of the plating 36, first conductive layer 20, second conductive layer 28, and conductive layer 27 on the substrate core can serve as ground.

Additionally, the description above is intended by way of example only and is not intended to limit the present invention in any way, except as set forth in the following claims.

What is claimed is:

1. A method of forming an embedded component in a substrate assembly, comprising the steps of:
    applying a first conductive layer on a first carrier;
    applying a first adhesive layer on the first conductive layer;
    placing a pre-processed substrate on the first adhesive layer, wherein the pre-processed substrate includes at least a via;
    placing the embedded component in the via, wherein the embedded component includes at least two conductive terminals;
    applying a second adhesive layer on at least portions of the pre-processed substrate and above at least portions of the embedded component;
    applying a second conductive layer on the second adhesive layer;
    placing a second carrier on the second conductive layer, and
    biasing the first and second carriers towards each other to create the substrate assembly having the embedded component between the first and second conductive layers such that adhesive from the first adhesive layer and the second adhesive layer flows into the via around the embedded component.

2. The method of claim 1, wherein the method further comprises the step of:
    removing at least one among the first carrier and the second carrier;
    forming an opening through at least one pair of layers among a first pair formed from the first conductive layer and the first adhesive layer and a second pair formed from the second conductive layer and the second adhesive layer to expose at least a conductive surface of the embedded component; and
    forming an interconnection between the conductive surface of the embedded component and at least one among the first conductive layer and the second conductive layer having the opening.

3. The method of claim 2, wherein the method further comprises the step of creating a conductive pattern on at least one among the first conductive layer and the second conductive layer.

4. The method of claim 1, wherein the step of applying the first conductive layer on the first carrier comprises the step of applying a copper sheet on a metallic plate servings as the first carrier.

5. The method of claim 1, wherein the step of applying the first adhesive layer comprises applying at least one among a first epoxy resin coat, a first thermosetting organic material layer, a first PTFE layer, a first thermoforming organic material layer, a first fiberglass reinforced prepreg layer, and a first thermal plastic dielectric layer over the first conductive layer.

6. The method of claim 1, wherein the step of placing the embedded component comprises the step of placing the embedded component in a vertical orientation within the via.

7. The method of claim 1, wherein the step of placing the embedded component comprises the step of dropping the embedded component into the via using a pick and place machine and the method further comprising the step of inspecting the via for the presence of the embedded component.

8. The method of claim 1, wherein the step of applying the second adhesive layer comprises applying at least one among a second epoxy resin coat, a second thermosetting organic material layer, a second PTFE layer, a second thermoforming organic material layer, a second fiberglass reinforced prepreg layer, and a second thermal plastic dielectric layer over at least portions of the pre-processed substrate and above at least portions of the embedded component and the step of applying the second conductive layer comprises the step of applying a second copper sheet on the second adhesive layer.

9. The method of claim 2, wherein the step of forming an opening comprises the step of at least one among plasma etching, chemical etching, YAG laser drilling, $CO_2$ laser drilling, and photo imaging.

10. The method of claim 3, wherein the step of creating the conductive pattern comprises at least one among the steps of plating, applying photolithography, and etching.

11. The method of claim 1, wherein the step of biasing the first and second carriers further comprises the step of curing the substrate assembly in a vacuum lamination press such that adhesive from the first adhesive layer and the second adhesive layer flows into the via around the embedded component.

12. The method of claim 11, wherein the embedded component becomes integrated in the substrate assembly and remains locked in place and aligned within the via.

13. A substrate assembly having at least one embedded component in a via of a substrate core, comprising:
    a first adhesive layer on a first conductive layer, wherein the first adhesive layer couples the first conductive layer to a bottom surface of the substrate core;
    an embedded component in the via, wherein the embedded component includes at least two conductive terminations;
    a second adhesive layer on at least portions of a top surface of the substrate core and above at least portions of the embedded component, wherein both the first adhesive layer and the second adhesive layer at least partially fill the via; and a second conductive layer on the second adhesive layer.

14. The substrate assembly of claim 13, wherein the substrate assembly further comprises an interconnection between a conductive surface of the embedded component and at least one among the first conductive layer and the second conductive layer.

15. The substrate assembly of claim 14, wherein the interconnection is formed through an opening that at least temporarily exposes at least a conductive surface of the embedded component and wherein the opening is through at least one pair of layers among a first pair formed from the first conductive layer and the first adhesive layer and a second pair formed from the second conductive layer and the second adhesive layer.

16. The substrate assembly of claim 13, wherein the substrate assembly further comprises a first interconnection between a first conductive termination of the embedded component and the first conductive layer and a second interconnection between a second conductive termination of the embedded component and the second conductive layer.

17. The substrate assembly of claim 16, wherein the first interconnection is formed through an opening in the first conductive layer and first adhesive layer and the second interconnection is formed through an opening in the second conductive layer and the second adhesive layer.

18. The substrate assembly of claim 13, wherein at least one among the first conductive layer and the second conductive layer form a conductive pattern on a surface of the substrate assembly.

19. The substrate assembly of claim 13, wherein the first conductive layer and the second conductive layer are formed from copper and the first adhesive layer and the second adhesive layer are formed from materials selected from the group comprising epoxy resin, epoxies, thermosetting organic materials, PTFEs, thermoforming organic materials, liquid dielectrics, glass reinforced prepregs, thermal plastic dielectrics, and paste dielectrics.

20. The substrate assembly of claim 13, wherein the substrate core comprises a substrate having a patterned conductive layer on at least one among the bottom surface and the top surface of the substrate core.

21. The substrate assembly of claim 13, wherein the embedded component is placed within the via in a vertical orientation.

22. The substrate assembly of claim 13, wherein the embedded component is a component selected from the group comprising a capacitor, a resistor, an inductor, and any combination thereof.

23. The substrate assembly of claim 14, wherein the interconnection forms a soldering pad for a device mounted on the substrate assembly.

24. The substrate assembly of claim 23, wherein the device is a ball grid array.

25. A method of forming an embedded component in a substrate assembly, comprising the steps of:

applying a first adhesive layer on a first carrier;

placing pre-processed substrate on the adhesive layer, wherein the pre-processed substrate includes at least a via;

placing the embedded component in the via, wherein the embedded component includes at least two conductive terminations;

applying a second adhesive layer on at least portions of the pre-processed substrate and above at least portions of the embedded component;

placing a second carrier on the second conductive layer; and biasing the first and second carriers towards each other to create the substrate assembly having the embedded component between the first and second adhesive layers.

26. A substrate assembly having at least one embedded component in a via of a substrate core, comprising:

a first adhesive layer coupled to a bottom surface of the substrate core;

an embedded component in the via, wherein the embedded component includes at least two conductive terminations and at least a portion of the first adhesive layer lies below the embedded component; and a second adhesive layer on at least portions of a top surface of the substrate core and above at least portions of the embedded component, wherein at least one among the first adhesive layer and the second adhesive layer at least partially fills the via.

27. The substrate assembly of claim 26, wherein the substrate assembly further comprises a first conductive layer adhered to the bottom surface of the substrate core using the first adhesive layer and a second conductive layer on the second adhesive layer.

* * * * *